(12) United States Patent
Elkhatib et al.

(10) Patent No.: US 12,142,266 B2
(45) Date of Patent: Nov. 12, 2024

(54) HYBRID VOICE COMMAND TECHNIQUE UTILIZING BOTH ON-DEVICE AND CLOUD RESOURCES

(71) Applicant: AONDEVICES, INC., Irvine, CA (US)

(72) Inventors: Mouna Elkhatib, Irvine, CA (US); Adil Benyassine, Irvine, CA (US)

(73) Assignee: AONDEVICES, INC., Irvine, CA (US)

( * ) Notice: Subject to any disclaimer, the term of this patent is extended or adjusted under 35 U.S.C. 154(b) by 375 days.

(21) Appl. No.: 17/275,746

(22) PCT Filed: Sep. 13, 2019

(86) PCT No.: PCT/US2019/051132
§ 371 (c)(1),
(2) Date: Mar. 12, 2021

(87) PCT Pub. No.: WO2020/056342
PCT Pub. Date: Mar. 19, 2020

(65) Prior Publication Data
US 2022/0036896 A1  Feb. 3, 2022

Related U.S. Application Data

(60) Provisional application No. 62/772,476, filed on Nov. 28, 2018, provisional application No. 62/731,681, (Continued)

(51) Int. Cl.
| | | |
|---|---|---|
| G10L 15/22 | (2006.01) | |
| G06N 3/02 | (2006.01) | |
| G06N 3/063 | (2023.01) | |
| G10L 15/08 | (2006.01) | |
| G10L 15/16 | (2006.01) | |
| G10L 15/30 | (2013.01) | |
| G10L 25/30 | (2013.01) | |

(Continued)

(52) U.S. Cl.
CPC ............ *G10L 15/22* (2013.01); *G06N 3/02* (2013.01); *G06N 3/063* (2013.01); *G10L 15/08* (2013.01); *G10L 15/16* (2013.01); *G10L 15/30* (2013.01); *G10L 25/30* (2013.01); *G10L 25/78* (2013.01); *H03M 1/12* (2013.01); *G10L 2015/088* (2013.01); *G10L 2015/223* (2013.01)

(58) Field of Classification Search
USPC ..................................................... 704/1–504
See application file for complete search history.

(56) References Cited

U.S. PATENT DOCUMENTS 9,070,367 B1 *  6/2015  Hoffmeister ............ G10L 15/30
9,697,828 B1 *  7/2017  Prasad .................... G10L 15/08
(Continued)

OTHER PUBLICATIONS

PCT Search Report and Written Opinion for Application No. PCT/US19/51132 (Dec. 4, 2019).

*Primary Examiner* — Marcus T Riley
(74) *Attorney, Agent, or Firm* — Stetina Brunda Garred & Brucker

(57) ABSTRACT

Systems and methods are presented for recognizing and responding to voice commands at a local system and selectively streaming audio to a network-based computing system to recognize voice commands when the user provides a specific voice command to stream to the network-based computing system and/or when the user provides a voice command that is not recognizable by the local system.

20 Claims, 7 Drawing Sheets

Related U.S. Application Data filed on Sep. 14, 2018, provisional application No. 62/731,657, filed on Sep. 14, 2018, provisional application No. 62/731,666, filed on Sep. 14, 2018, provisional application No. 62/731,670, filed on Sep. 14, 2018.

(51) Int. Cl.
*G10L 25/78* (2013.01)
*H03M 1/12* (2006.01)

(56) References Cited

U.S. PATENT DOCUMENTS

| | | | |
|---|---|---|---|
| 9,734,830 B2* | 8/2017 | Lindahl | G10L 17/24 |
| 10,332,524 B2* | 6/2019 | Lindahl | G06F 3/167 |
| 10,553,215 B2* | 2/2020 | Saddler | G10L 13/02 |
| 10,720,160 B2* | 7/2020 | Schramm | G10L 15/30 |
| 10,733,993 B2* | 8/2020 | Kudurshian | G06F 16/9032 |
| 10,741,181 B2* | 8/2020 | Garg | G10L 15/1815 |
| 10,748,546 B2* | 8/2020 | Kim | G10L 15/30 |
| 11,380,310 B2* | 7/2022 | Acero | G10L 15/22 |
| 11,495,218 B2* | 11/2022 | Newendorp | G10L 15/22 |
| 11,551,700 B2* | 1/2023 | Jones | G10L 15/22 |
| 11,630,525 B2* | 4/2023 | Hindi | G06F 3/0414 |
| | | | 345/156 |
| 2011/0077943 A1 | 3/2011 | Miki et al. | |
| 2016/0189716 A1* | 6/2016 | Lindahl | G10L 17/24 |
| | | | 704/251 |
| 2017/0323642 A1* | 11/2017 | Lindahl | G10L 15/32 |
| 2018/0075336 A1 | 3/2018 | Huang et al. | |
| 2018/0197533 A1* | 7/2018 | Lyon | G10L 15/02 |
| 2019/0043488 A1* | 2/2019 | Bocklet | G10L 15/22 |
| 2020/0125162 A1* | 4/2020 | D'Amato | H04R 29/005 |
| 2020/0285912 A1* | 9/2020 | Brebner | G06V 30/19173 |
| 2020/0285977 A1* | 9/2020 | Brebner | G06N 5/022 |

\* cited by examiner

# HYBRID VOICE COMMAND TECHNIQUE UTILIZING BOTH ON-DEVICE AND CLOUD RESOURCES

CROSS-REFERENCE TO RELATED APPLICATIONS

This application is a national stage application, filed under 35 U.S.C. § 371, of International Patent Application No. PCT/US2019/051132, filed on Sep. 13, 2019 which claims priority under 35 U.S.C. § 119(e) to U.S. Provisional Patent Application No. 62/772,476 filed on Nov. 28, 2018, U.S. Provisional Patent Application No. 62/731,681 filed on Sep. 14, 2018, U.S. Provisional Patent Application No. 62/731,657 filed on Sep. 14, 2018, U.S. Provisional Patent Application No. 62/731,666 filed on Sep. 14, 2018, and U.S. Provisional Patent Application No. 62/731,670 filed on Sep. 14, 2018, the entire contents of which are incorporated herein by reference in their entirety.

BACKGROUND

The present application relates to a hybrid system that includes voice activity detection.

The control over devices, and in particular mobile devices, traditionally requires the user to physically interact with the device. For example, a user presses icons on a mobile phone together with entering textual information to cause the mobile phone to stream audio content from the Internet through the speakers of the mobile phone. When the user desires to change the audio content, the user once again presses icons together with entering textual information on the mobile phone. The user interacting with the device permits changing music but is problematic to undertake when the user is driving a vehicle.

The control over devices, and in particular mobile devices, may be undertaken by voice commands with the device. For example, a user may activate the mobile device mode to receive the voice command by pressing a button. The user then issues an audio voice command to the mobile device of his desired action. The mobile device streams this audio voice command to a network-based server on the Internet, which interprets the audio voice command using voice recognition software and provides a suitable response to the mobile device. For example, the server may provide an audio stream that is played on the mobile device. Unfortunately, streaming audio voice commands to the network-based server degrades the user's privacy because the data can more readily be misappropriated.

SUMMARY

The present application relates to a hybrid system that includes voice activity detection.

An example electronic device can include a non-transitory computer readable storage medium, a network transceiver, and an electrical circuit. The non-transitory computer readable storage medium can have command phrases stored thereon. Each of the command phrases can be associated with a respective command instruction. The electrical circuit can be in communication with the memory store and the network transceiver. The electrical circuit can be configured to receive an audio signal, monitor the audio signal to determine a presence of at least one of the command phrases, and provide the respective command instruction associated with the detected command phrase. One of the command phrases can be associated with a respective command instruction to cause the network transceiver to transmit the audio signal. Another command phrase can be associated with a respective command instruction configured to be executed by the portable electronic device without transmission of the audio signal. Yet another command phrase can be associated with a respective command instruction to cause the network transceiver to cease transmitting the audio signal.

The portable electronic device can be a smart speaker. The portable electronic device can be an "always-listening" device.

The electronic circuit can be configured to begin monitoring the audio signal in response to powering on the electrical circuit and continuously monitor the audio signal while the electrical circuit is powered on. The command phrases can include one or more words selected from a list consisting of: "weather", "phone", "music", "call", "off", "on", "increase", "volume", "decrease", "open", "cloud", and "close". The storage medium can have a wake word stored thereon. The electrical circuit can be configured to monitor the audio signal to determine a presence of the wake word.

The electrical circuit can include a digital signal processor.

The electrical circuit can include a neural network circuit. The neural network can include a convolutional neural network, a recurrent neural network, other suitable neural network as would be appreciated and understood by a person of ordinary skill in the art, or a combination of the aforementioned neural networks.

The electrical circuit can include a (VAD) module configured to monitor the audio signal to determine a presence of a voice, a keyword spotting module in communication with the VAD module and the memory store, and a detection and recognition of commands module in communication with the memory store, the network transceiver, and the keyword spotting module. The keyword spotting module can be configured to activate in response to the presence of the voice in the audio signal determined by the VAD and, while activated, monitor the audio signal to determine a presence of the wake word. The detection and recognition of commands module can be configured to activate in response to the presence of the wake word determined by the keyword spotting module and, while activated, monitor the audio signal to determine a presence of a command phrase, and provide a command instruction associated with the detected command phrase.

While the electronic device is powered on, the audio signal can be continuously being monitored by the VAD, monitored by the keyword spotting module, monitored by the detection and recognition of commands module, and/or transmitted by the transceiver.

The keyword spotting module can be configured to deactivate at a first predetermined time period from a time at which the keyword spotting module is activated.

The VAD can be configured to pause monitoring of the audio signal to determine the presence of the voice in the audio signal while the keyword spotting module is activated.

The detection and recognition of commands module can be configured to deactivate at a second predetermined time period from a time at which the detection and recognition of commands module is activated.

The VAD can be configured to pause monitoring of the audio input signal to determine the presence of the voice in the audio input signal while the detection and recognition of commands module is activated.

An example system can include a non-transitory computer readable storage medium, a network transceiver, and an electrical circuit. The non-transitory computer readable storage medium can have command phrases and a wake word stored thereon. Each of the command phrases can be associated with a respective command instruction. The electrical circuit can be connected to the storage medium and the network transceiver. The electrical circuit can be configured to receive an audio signal, monitor the audio signal to for a predetermined time period, compare the audio signal during the predetermined time period to the plurality of command phrases, and based on the comparison, either provide a command instruction associated with a command phrase of the plurality of command phrases or transmit the audio input signal monitored by the detection and recognition of commands module during the predetermined time period to the network transceiver.

The system can be a portable electronic device.

The system can be a smart speaker.

The system can be an "always-listening" device.

The electrical circuit can be configured to begin monitoring the audio signal in response to powering on the electrical circuit and continuously monitor the audio signal while the electrical circuit is powered on.

The command phrases can include one or more words selected from a list consisting of: "weather", "phone", "music", "call", "off", "on", "increase", "volume", and "decrease".

The electrical circuit can include a digital signal processor.

The electrical circuit can be configured to monitor the audio signal to determine a presence of the wake word.

The electrical circuit can include a neural network circuit. The neural network can include a convolutional neural network, a recurrent neural network, other suitable neural network as would be appreciated and understood by a person of ordinary skill in the art, or a combination thereof.

The electrical circuit can include a VAD module configured to monitor the audio input signal to determine a presence of a voice in the audio input signal, a keyword spotting module, and a detection and recognition of commands module. The keyword spotting module can be connected to the VAD module and the memory store. The keyword spotting module can be configured to activate in response to the presence of the voice in the audio input signal determined by the VAD and, while activated, monitor the audio input signal to determine a presence of the wake word. The detection and recognition of commands module can be connected to the memory store, the network transceiver, and the keyword spotting module. The recognition of commands module can be configured to activate in response to the presence of the wake word determined by the keyword spotting module and, while activated, monitor the audio input signal to for the predetermined time period, compare the audio input signal during the predetermined time period to the command phrases on the storage medium, and based on the comparison, either provide the command instruction associated with a command phrase or transmit the audio input signal monitored by the detection and recognition of commands module during the predetermined time period to the network transceiver.

While the system is powered on, the audio input signal is continuously being monitored by the VAD, monitored by the keyword spotting module, monitored by the detection and recognition of commands module, and/or transmitted by the transceiver.

The keyword spotting module can be configured to deactivate at a first predetermined time period from a time at which the keyword spotting module is activated.

The VAD can be configured to pause monitoring of the audio input signal to determine the presence of the voice in the audio input signal while the keyword spotting module is activated.

The detection and recognition of commands module can be configured to deactivate at a second predetermined time period from a time at which the detection and recognition of commands module is activated.

The VAD can be configured to pause monitoring of the audio input signal to determine the presence of the voice in the audio input signal while the detection and recognition of commands module is activated.

An example method can include one or more of the following steps presented in no particular order, and can include additional steps as would be appreciated and understood by a person of ordinary skill in the art. An electronic device can perform the steps of monitoring an audio signal, comparing the audio signal to a plurality of predetermined command phrases stored on the electronic device, detecting a first command phrase of the plurality of command phrases in the audio signal, executing a first command instruction associated with the first command phrase without the audio signal being transmitted from the electronic device, detecting a second command phrase of the plurality of command phrases in the audio signal, and transmitting the audio signal to an external network in response to detecting the second command phrase.

The electronic device can also perform the steps of monitoring the audio signal to determine a presence of a voice in the audio signal, monitoring the audio signal to determine a presence of the wake word in response to determining the presence of the voice in the audio signal, and comparing the audio signal to the predetermined command phrases in response to determining the presence of the wake word.

Another example method can include one or more of the following steps presented in no particular order, and can include additional steps as would be appreciated and understood by a person of ordinary skill in the art. An audio signal can be compared to predetermined command phrases for a predetermined period of time. Based on the comparison, one of two things can be performed: (1) a command instruction associated with a predetermined command phrase can be provided, or (2) the audio signal compared during the predetermined time period can be transmitted to an external network.

The audio signal can be monitored to determine a presence of a voice in the audio signal. In response to determining the presence of the voice in the audio signal, the audio signal can be monitored to determine a presence of the wake word. In response to determining the presence of the wake word, for the predetermined time period, the audio signal can be compared to the predetermined command phrases.

Other aspects and features of the present disclosure will become apparent to those of ordinary skill in the art, upon reviewing the following detailed description in conjunction with the accompanying figures.

BRIEF DESCRIPTION OF THE DRAWINGS

Reference will now be made to the accompanying drawings, which are not necessarily drawn to scale.

DETAILED DESCRIPTION OF PREFERRED EMBODIMENTS

Figure 1:
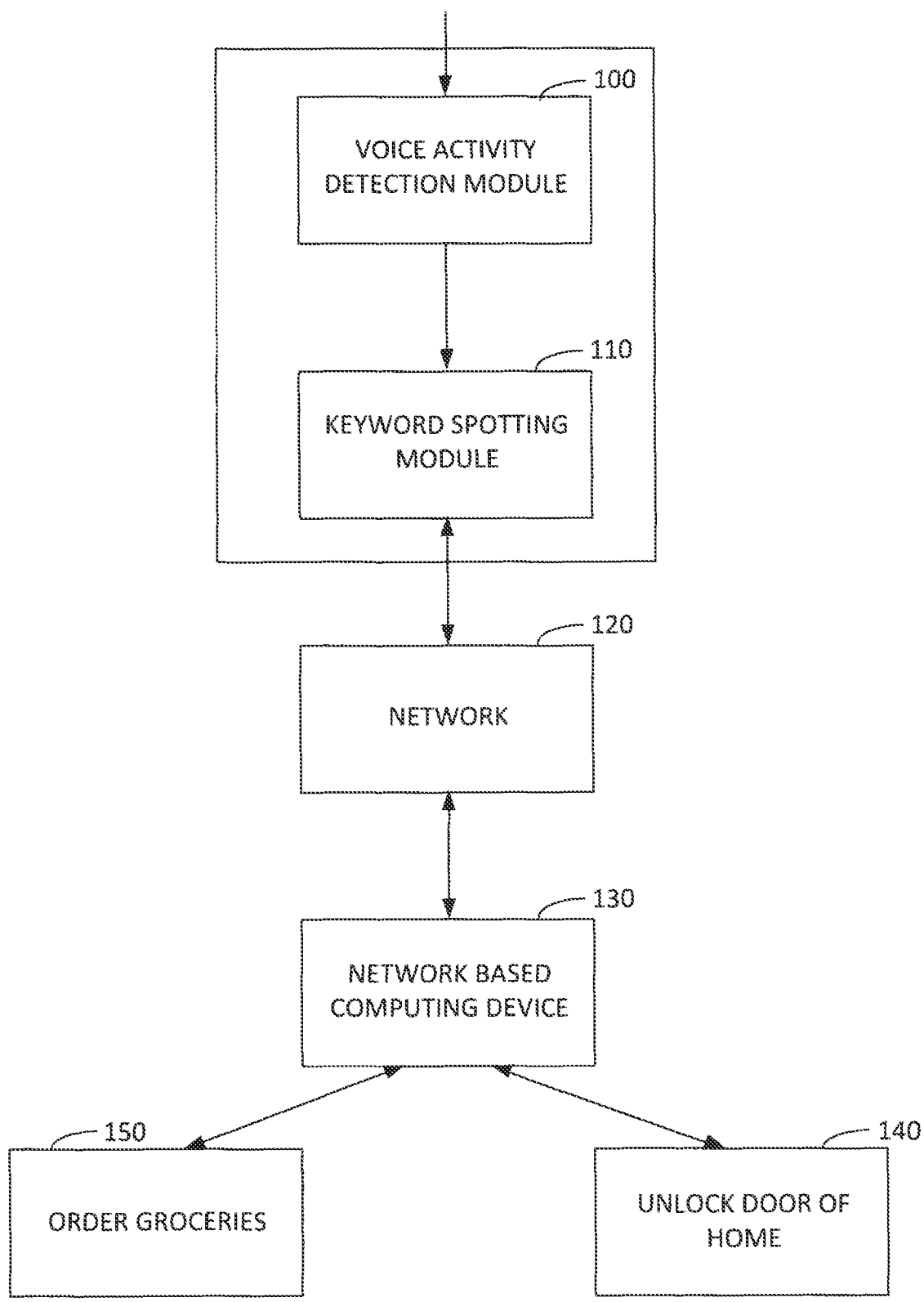
FIG. 1 illustrates a network-based voice recognition system.

Although example embodiments of the disclosed technology are explained in detail herein, it is to be understood that other embodiments are contemplated. Accordingly, it is not intended that the disclosed technology be limited in its scope to the details of construction and arrangement of components set forth in the following description or illustrated in the drawings. The disclosed technology is capable of other embodiments and of being practiced or carried out in various ways.

It must also be noted that, as used in the specification and the appended claims, the singular forms "a," "an" and "the" include plural referents unless the context clearly dictates otherwise. By "comprising" or "containing" or "including" it is meant that at least the named compound, element, particle, or method step is present in the composition or article or method, but does not exclude the presence of other compounds, materials, particles, method steps, even if the other such compounds, material, particles, method steps have the same function as what is named.

In describing example embodiments, terminology will be resorted to for the sake of clarity. It is intended that each term contemplates its broadest meaning as understood by those skilled in the art and includes all technical equivalents that operate in a similar manner to accomplish a similar purpose. It is also to be understood that the mention of one or more steps of a method does not preclude the presence of additional method steps or intervening method steps between those steps expressly identified. Steps of a method may be performed in a different order than those described herein without departing from the scope of the disclosed technology. Similarly, it is also to be understood that the mention of one or more components in a device or system does not preclude the presence of additional components or intervening components between those components expressly identified.

As used herein, an "audio signal" is understood to mean an electrical signal that is representative of a sound carried by acoustic waves. For instance, an "audio signal" can be an electrical signal provided by an acoustic transducer such as a microphone, an analogue electrical signal, a digital electrical signal, an analogue electrical signal that has been digitized, an electrical signal that has been amplified, an electrical signal that has been filtered, an electrical signal that has been sampled, and/or an electrical signal that has been decimated.

As used herein, an "audio stream" is understood to mean an "audio signal" that is continuously provided and/or generated. For instance, an "audio stream" can be an "audio signal" that is a real-time representation of acoustic waves impending on an acoustic transducer.

A voice command is a part of a class of voice controlled systems and the so-called "smart speaker" systems. Example of smart speakers are the Echo available from Amazon, the HomePod available from Apple, and the Home available from Google. Each of these smart speaker systems include an "always-listening" system where the system substantially continuously listens for a keyword to be spoken. Upon identifying a keyword that is spoken, the system wakes up and processes subsequent voice commands that it receives for a period of time and performs an appropriate action in response thereto.

Voice activity detection (VAD), also generally referred to as speech activity detection or speech detection, is a technique used for speech processing in which the presence of human speech or the lack thereof of human speech is detected. The principal applications for voice activity detection is for speech coding, speech processing, and speech recognition.

Various VAD techniques have been developed to provide different features. Each of the various VAD techniques include compromises, such as between latency, sensitivity, accuracy, and computational cost. Often the technique includes formulating a decision on a frame by frame basis using instantaneous measures of the divergence between the speech and the noise. There are many different divergence measures that may be used, such as for example, spectral slope, cepstral, correlation coefficients, weighted cepstral, log likelihood ratio, and modified distance measures.

In addition to the choice of the VAD technique, the system also typically makes a choice between having voice detected as noise or noise detected as voice (e.g., a choice between a false positive and a false negative). One example of a VAD technique to detect speech is described in Ramírez J, Segura J, Benitez C, De La Torre A, Rubio A: "Efficient voice activity detection algorithms using long-term speech information", in Speech Communications, Vol. 42, pp. 271-287, 2004, incorporated by reference herein in its entirety.

In general, each of the VAD techniques detect the presence of human speech or the absence of human speech. One advantage of using the VAD based technique includes lowering the system power because the system is maintained in an idle mode until speech is detected. Another advantage of using the VAD based technique includes securing the user privacy by blocking sound streaming until speech is detected, after which it enables a second stage that checks whether the user is addressing the device with a "wake word". Traditionally, the "wake work" is understood to be a voiced word or phrase. In some examples presented herein, the "wake word" can further be a voiced sound having no linguistic definition. In some examples presented herein, the traditional VAD technique can be replaced or modified in a voice command system to respond to a "wake word" that is a sound not generated by a human voice such as a siren, a sound of glass breaking, a door knock sound, sound of footsteps, and the like.

Referring to FIG. 1, one technique of receiving and processing commands for a voice-controlled system, such as a smart speaker system, is a voice activity detection module 100 detecting the occurrence of voice activity. The voice activity detection module 100 is preferably included within the device, such as a smart speaker. Upon detecting the occurrence of voice activity by the voice activity detection module 100, a keyword spotting module 110 monitors the subsequent voice activity for a period of time for a keyword/trigger word/wake-word or the like (generally referred to herein as a wake word). The keyword spotting module 110 is preferably included within the device, such as a smart speaker. If such a wake word is not detected during the subsequent period of time, the system resumes its voice activity monitoring by the voice activity detection module 100 for the next voice activity. If such a wake word is detected during the subsequent period of time by the keyword spotting module 110, then the audio stream is streamed across a network 120 to a network-based (e.g., Internet) computing device (e.g., cloud-based server) 130 to detect and recognize subsequent commands during for a period of time. The subsequent commands are processed, and action is taken based upon the content of the subsequent commands. For example, one action may be to send data to the device to play music on the smart speaker. For example, another action may be to unlock the door of a home 140. For example, another action may be to order groceries 150.

As illustrated in FIG. 1, the network-based computing device 130 has nearly unlimited processing power, especially when included as part of a cloud-based server system with thousands to millions or more servers for natural language processing for the audio stream. With such nearly unlimited processing capability, this enables the user to interact with the speech recognition system on the network-based computing device 130 using a large vocabulary, in multiple languages, in more complex and intuitive ways. Unfortunately, all the audio stream that is processed by the network-based computing device using the natural language processing is transferred across the network resulting in reduced privacy of the audio stream by the user. Moreover, a relatively high false detection occurs by the keyword spotting module 110 because its detection for the wake word is typically relatively broadly defined so that it doesn't often miss detecting the occurrence of the wake word spoken by a nearly endless variety of different potential users. Also, the device may appear to be somewhat sluggish on its responsiveness, because the audio stream is transferred to the network-based computing device, then the network-based computing device processes the audio stream, and a responsive command or data stream is provided to the device through the network, all of which incurs a significant latency in the apparent responsiveness of the device. In addition, the device tends to have limited reliability due to the intermittent nature of the connection through the network 120 to the network-based computing device 130. Moreover, the entire system, inclusive of the device and the network-based computing device requires a substantial amount of energy to process audio streams.

Figure 2:
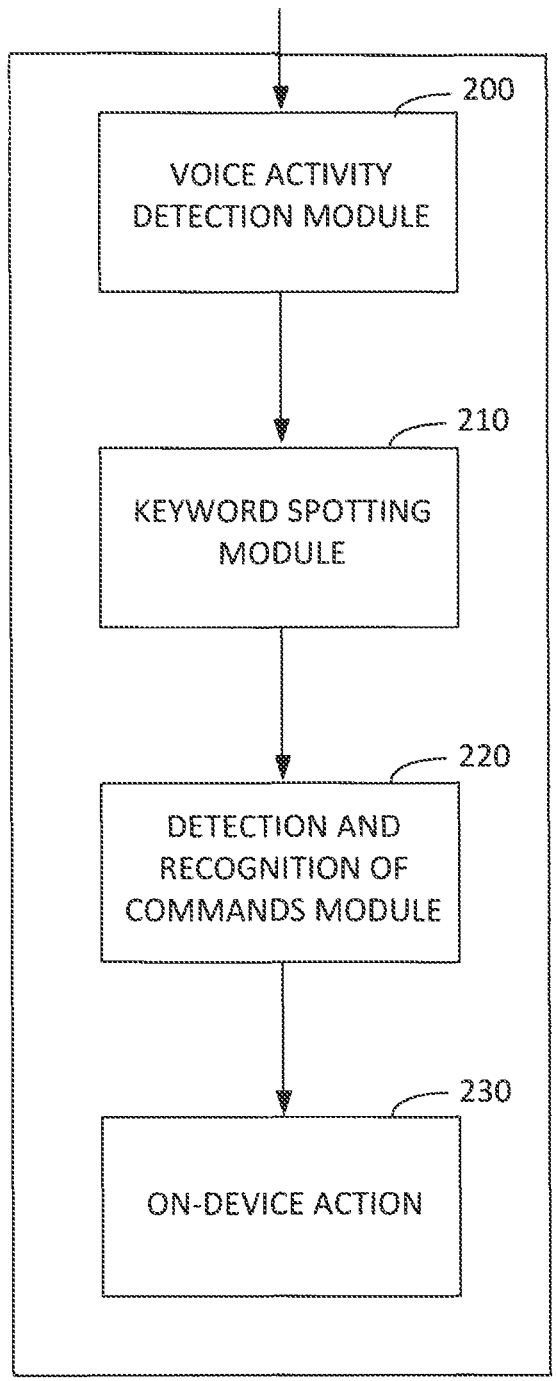
FIG. 2 illustrates a non-network-based voice recognition system.

Referring to FIG. 2, another technique of receiving and processing commands for a voice-controlled system, such as a smart speaker system, is a voice activity detection module 200 detecting the occurrence of voice activity. The voice activity detection module 200 is preferably included within the device, such as a smart speaker. Upon detecting the occurrence of voice activity by the voice activity detection module 200, a keyword spotting module 210 monitors the subsequent voice activity for a period of time for a keyword/trigger word/wake-word or the like (generally referred to herein as a wake word). The keyword spotting module 210 is preferably included within the device, such as a smart speaker. If such a wake word is not detected during the subsequent period of time, the system resumes its voice activity monitoring by the voice activity detection module 200 for the next voice activity. If such a wake word is detected during the subsequent period of time by the keyword spotting module 210, then the audio stream is processed by a detection and recognition of commands module 220 to detect and recognize subsequent commands for a period of time. The detection and recognition of commands module 220 is preferably included within the device, such as a smart speaker. The subsequent commands are processed, and action is taken on the device 230 based upon the content of the subsequent commands. For example, one action may be to play music on the smart speaker. For example, another action may be to provide the weather.

As illustrated in FIG. 2, the non-network-based device has limited processing power for natural language processing for the audio stream. With such limited processing capability, this enables the user to interact with the speech recognition system on the device using a limited vocabulary, often in a single language, in relatively simple and non-intuitive way. With the audio stream being processed by the device using the natural language processing it has relatively high privacy of the audio stream by the user. Moreover, a relatively high false detection occurs by the keyword spotting module because its detection for the wake word is typically relatively broadly defined so that it doesn't often miss detecting the occurrence of the wake word spoken by a nearly endless variety of different potential users. Also, the device may appear to be relatively responsive, because the audio stream is not transferred from the device, is processed by the device, and the command or data stream is acted upon locally, all of which does not incur a significantly latency in the apparent responsiveness of the device. In addition, the device tends to have relatively high reliability due to all the processing occurring on the device. Moreover, the entire system tends not to require a substantial amount of energy to process audio streams.

Figure 3:
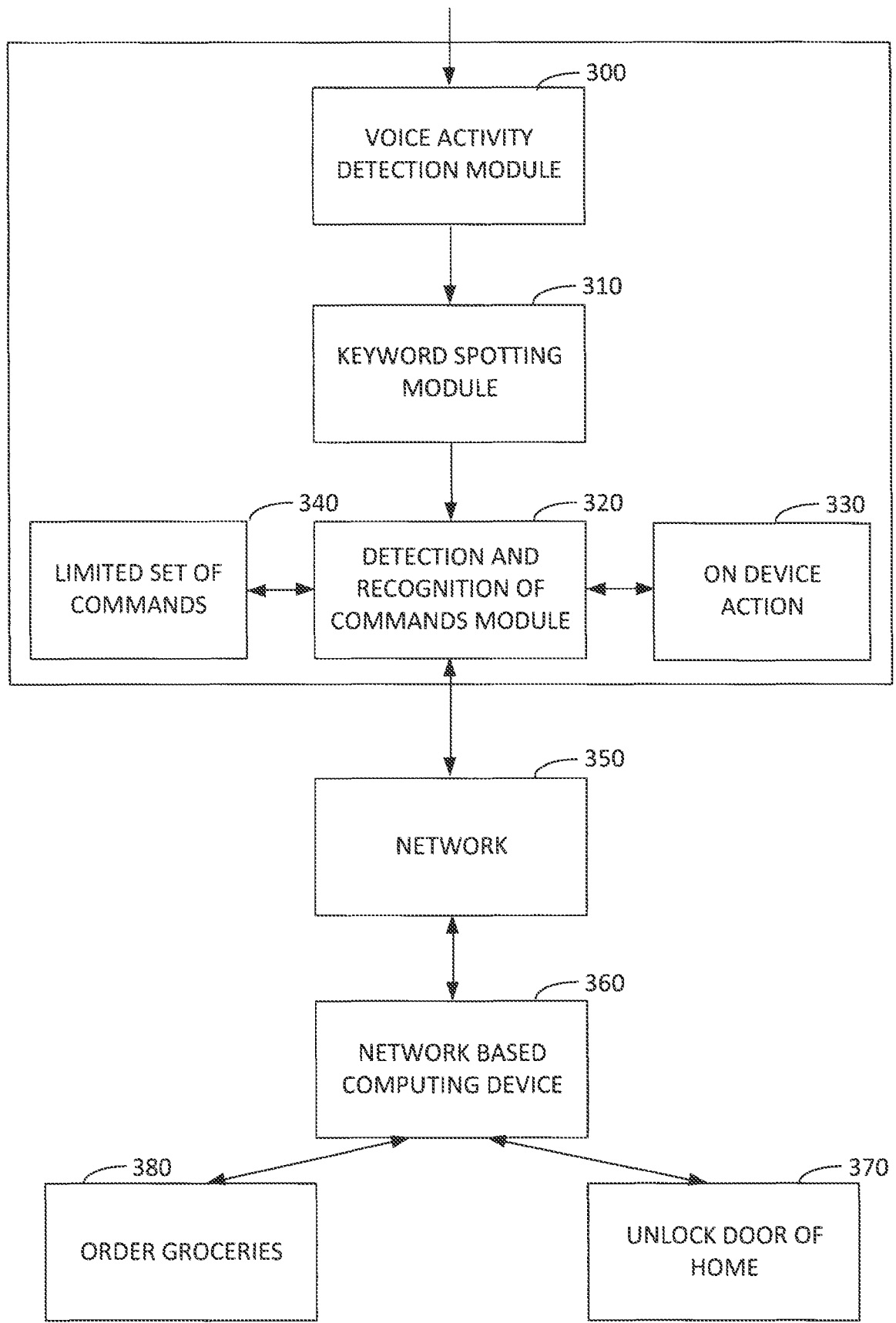
FIG. 3 illustrates a hybrid based voice recognition system.

Referring to FIG. 3, another technique of receiving and processing commands for a voice-controlled system, such as a smart speaker system, is a voice activity detection module 300 detecting the occurrence of voice activity. The voice activity detection module 300 is preferably included within the device, such as a smart speaker. Upon detecting the occurrence of voice activity by the voice activity detection module 300, a keyword spotting module 310 monitors the subsequent voice activity for a period of time for a keyword/trigger word/wake-word or the like (generally referred to herein as a wake word). The keyword spotting module 310 is preferably included within the device, such as a smart speaker. If such a wake word is not detected during the subsequent period of time, the system resumes its voice activity monitoring by the voice activity detection module 300 for the next voice activity. If such a wake word is detected during the subsequent period of time by the keyword spotting module 310, then the audio stream is processed by a detection and recognition of commands module 320 to detect and recognize subsequent commands during for a period of time. The detection and recognition of commands module 320 is preferably included within the device, such as a smart speaker. The subsequent commands are processed, and action is taken on the device 330 based upon the content of the subsequent commands. Preferably, the detection and recognition of commands module 320 processes voice activity for a limited set of commands 340. The limited set of commands may include, for example, "current weather", "make a phone call", "play music", "turn off", "turn on", "increase volume", "decrease volume", etc.

At any given time, therefore, the voice-controlled system can be continuously processing and/or transmitting an incoming audio signal. Meaning, at all times that an audio signal is provided to the system, the audio signal is being monitored by the voice activity detection module 300, monitored by the keyword spotting module 310, monitored by the detection and recognition of commands module 320, or transmitted to an external network 350 for processing on a network-based computing device 360.

As it may be observed, in a manner similar to the embodiment illustrated in FIG. 2, the system is relatively responsive, is highly reliable, requires limited processing power, and the audio data is highly private. In addition, the processing for the natural language is simplified by the including a limited list of commands that are available.

To increase the capabilities of natural language processing of the audio stream, for the audio stream that is not one of the limited set of commands 340, the device may stream an audio stream across a network 350 to a network-based (e.g., Internet) computing device (e.g., cloud-based server) 360 to detect and recognize subsequent commands during for a period of time. The subsequent commands are processed, and action is taken based upon the content of the subsequent commands. For example, one action may be to send data to the device to play music on the smart speaker. For example, another action may be to unlock the door of a home 370. For example, another action may be to order groceries 380. As it may be observed, in a manner similar to the embodiment illustrated in FIG. 1, the system includes extended natural language vocabulary with nearly unlimited computing resources for a robust system.

Figure 4:
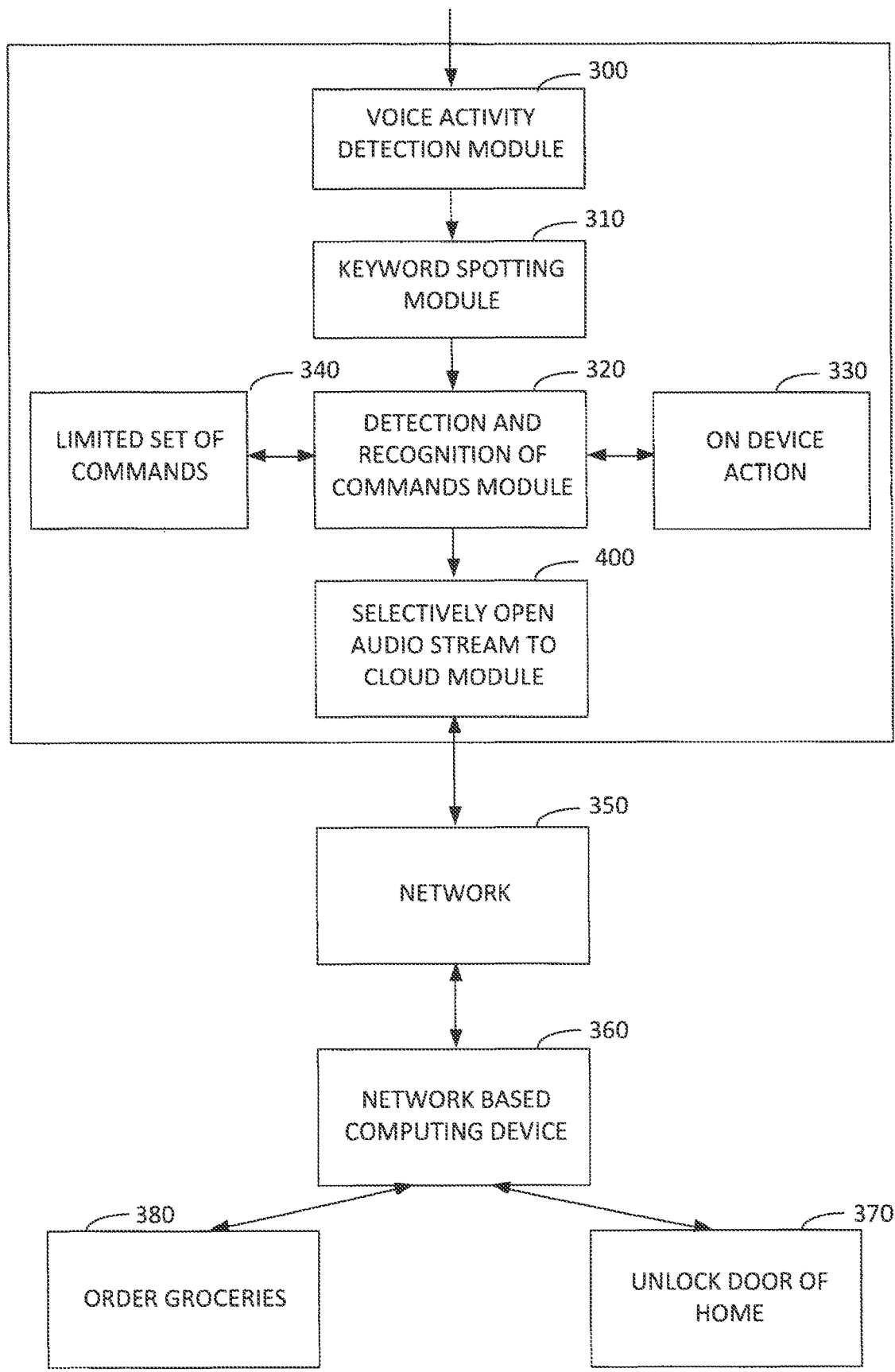
FIG. 4 illustrates another hybrid based voice recognition system.

Referring to FIG. 4, a modified technique, may include a selectively open audio stream to cloud module 400 that selectively permits communication with the network 350 based upon a suitable command from the user. For example, a suitable audio stream command may include "Open The Cloud" to permit communication to and/or from the network 350. The communication with the network may be for a limited time duration or until it is turned off, such as with a suitable audio stream command including "Close The Cloud". In this manner, the user maintains control of whether their audio stream is shared with the cloud, which permits the users to more readily control their privacy and make use of an external natural language vocabulary for more complex commands.

Preferably, for selectively permitting communication with the network the combination of the wake word (e.g., Baymax) together with the keyword(s) (e.g., Open The Cloud) is used (e.g., Baymax Open The Cloud). In this manner, the likelihood of having a false trigger is substantially reduced compared with a wake word, or a wake word followed by a subsequent command for permitting network communication.

Preferably, for the limited set of commands the combination of the wake word (e.g., Baymax) together with the keyword(s) (e.g., What Is The Weather) is used (e.g., Baymax What Is The Weather). In this manner, the likelihood of having a false trigger is substantially reduced compared with a wake word, or a wake word followed by a subsequent command for the limited set of commands.

Preferably the voice recognition is implemented using a digital signal processor or a neural network circuit. The neural network may be implemented as a convolutional neural network or as a recurrent neural network, or any other suitable type of neural network.

Figure 5:
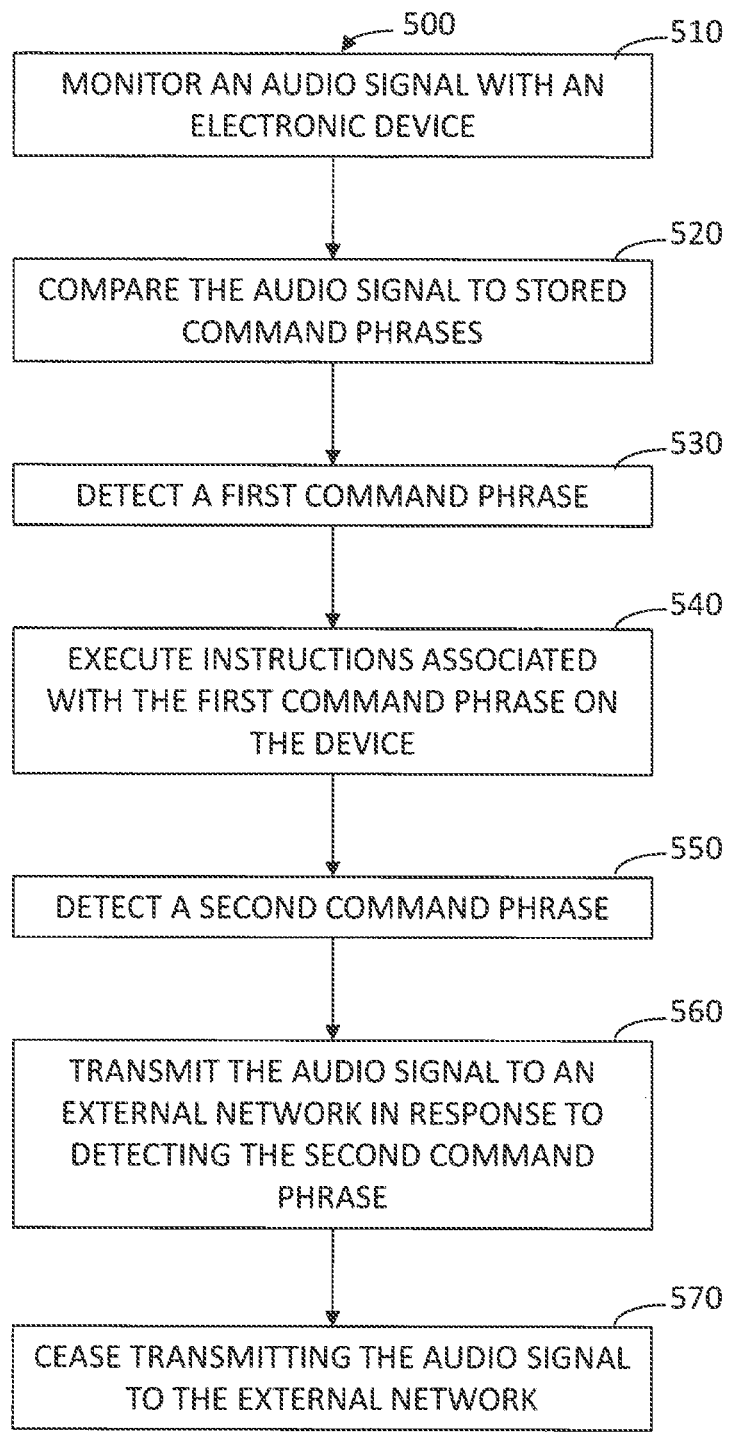
FIG. 5 is a flow diagram for a method for detecting and responding to voice commands in a hybrid based voice recognition system.

Referring to FIG. 5, a method 500 for detecting and responding to voice commands in a hybrid based voice recognition system can include the following steps. The steps can be executed in various orders as would be appreciated and understood by a person of ordinary skill in the art according the the teachings of this disclosure. One or more of the steps can be executed by a hybrid based voice recognition system such as the system 400 illustrated in FIG. 4, variations thereof, and alternatives thereof as would be appreciated and understood by a person of ordinary skill in the art according to teachings of the present disclosure.

At step 510, an audio signal can be monitored with an electronic device. The electronic device can be an electronic device that houses the hybrid based voice recognition system. The electronic device can be an electronic device such as described herein, a variation thereof, or an alternative thereof as would be appreciated and understood by a person of ordinary skill in the art according to the teachings of this disclosure. The audio signal can be an audio stream. The audio signal can be continuously monitored. The audio signal can be monitored in an always-on fashion.

At step 520, the audio signal can be compared to command phrases stored in the electronic device. The command phrases can the limited set of commands 340 such as illustrated in FIG. 4, otherwise described herein, alternatives thereof, and variations thereof as would be appreciated and understood by a person of ordinary skill in the art according to the teachings of the present disclosure.

The comparison can be performed locally on the electronic device. The command phrases can be stored in a memory store in the electronic device, or the command phrases can be otherwise stored such that they are accessible to the electronic device without the electronic device connecting to a bluetooth network, a WiFi network, an internet network, or other such external network. For example, the electronic device can be a portable electronic device and the command phrases can be stored on non-transitory computer readable medium connected to the electronic device and portable together with the portable electronic device. The command phrases can be a voiced sound such as a string of voiced sounds, a word, a string of words, or a non-voiced sound such as a siren, a finger snap, a clap, etc. In some examples, step 520 can be executed by a detection and recognition of commands module such as described herein, variations thereof, or alternatives thereto as would be appreciated and understood by a person of ordinary skill in the art according to the teachings of this disclosure. Additionally, or alternatively, step 520 can be executed by a neural network.

At step 530, the comparison of the audio signal to the stored command phrases at step 520 can result in the detection of a first command phrase in the audio signal that matches one of the stored command phrases. The first command phrase can be associated with instructions that can be executed by the electronic device.

At step 540, in response to detecting the first command phrase, the instructions associated with the first command phrase can be executed on the electronic device. The instructions can be executed to cause on device action 330 such as illustrated in FIG. 4, otherwise described herein, alternatives there of, and variations thereof as would be appreciated and understood by a person of ordinary skill in the art according to teachings of the present disclosure. The command instructions can be locally accessible to the electronic device such that the command instructions are accessible without the electronic device connecting to a bluetooth network, WiFi network, an internet network, or other such external network.

Steps 510 through 540 can thereby be executed wholly on the electronic device. Steps 510 through 540 can be repeated on the electronic device such that each time the steps are repeated, a new command phrase (potentially different to or the same as) the first command phrase is detected at step 530 and associated instructions are executed at step 540.

At step 550, a second command phrase matching one of the stored command phrases can be detected. The second command phrase can be detected before or after the first command phrase is detected. The second command phrase can be detected as a result of a comparison step such as the comparison step 520.

At step 560, the audio signal can be transmitted to an external network such as a bluetooth network, WiFi network, an internet network, or other such external network in response to detecting the second command phrase.

At step 570, the electronic device can cease transmitting the audio signal to the external network. In some examples, the electronic device can be configured to continue to monitor for a third command phrase while the audio signal is connected to the external network, and the electronic device can cease transmitting the audio signal in response to detecting the third command phrase. Additionally, or alternatively, the electronic device can cease transmitting following a predetermined time period. Additionally, or alternatively, the electronic device can include a VAD, and the audio signal can cease transmitting when the VAD determines that a user has stopped speaking.

Figure 6:
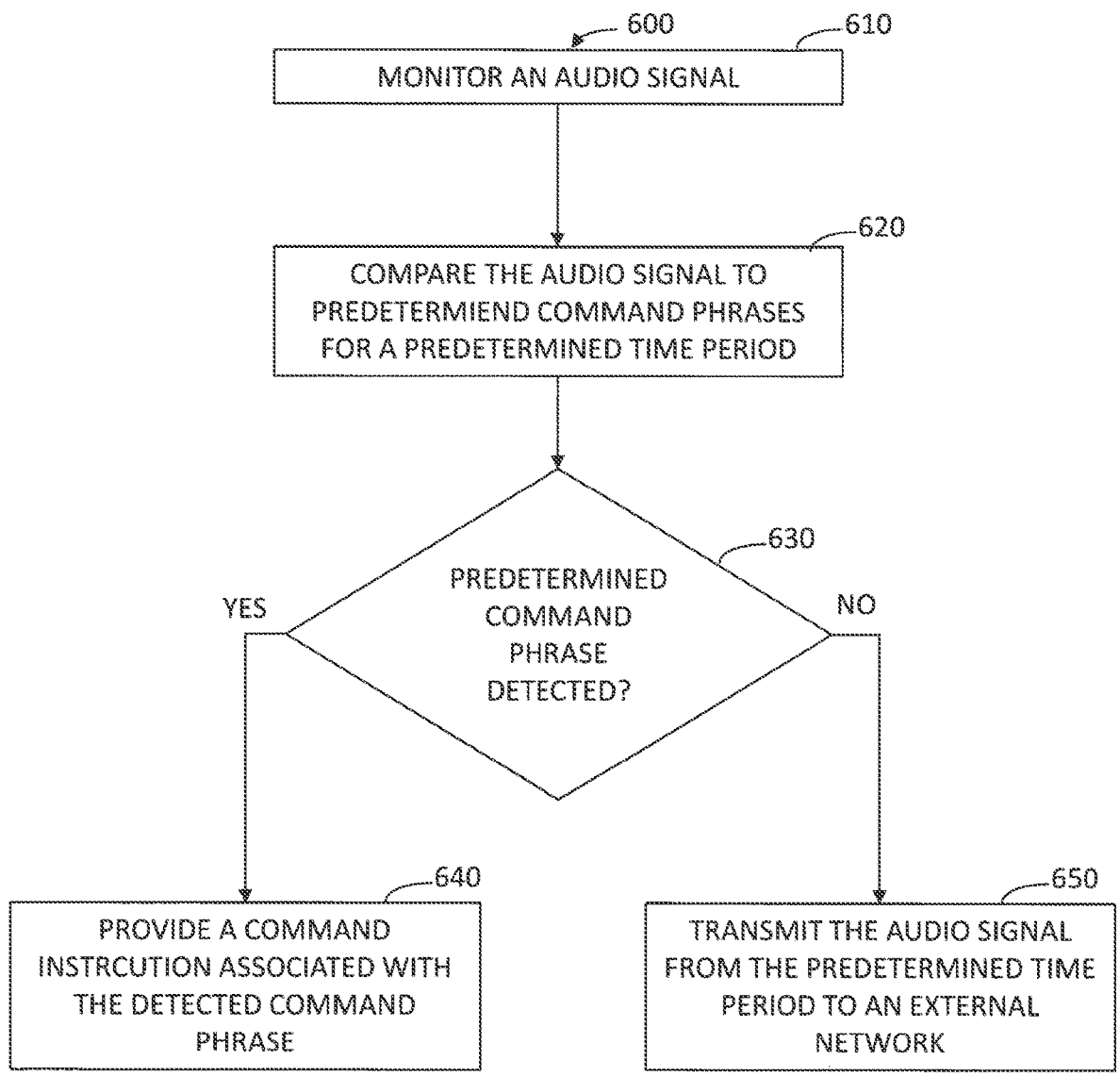
FIG. 6 is a flow diagram for another method for detecting and responding to voice commands in a hybrid based voice recognition system.

Referring to FIG. 6, another method 600 for detecting and responding to voice commands in a hybrid based voice recognition system can include the following steps. The steps can be executed in various orders as would be appreciated and understood by a person of ordinary skill in the art according the the teachings of this disclosure. One or more of the steps can be executed by a hybrid based voice recognition system such as the system 300 illustrated in FIG. 3, variations thereof, and alternatives thereof as would be appreciated and understood by a person of ordinary skill in the art according to teachings of the present disclosure.

At step 610, an audio signal can be monitored. The electronic device can be monitored by a singular electronic device or a networked computing system. The electronic device can be an electronic device that houses the hybrid based voice recognition system. The networked computing system can be a network that includes the hybrid based voice recognition system. The electronic device and networked computing system can be an electronic device or networked computing system such as described herein, a variation thereof, or an alternative thereof as would be appreciated and understood by a person of ordinary skill in the art according to the teachings of this disclosure. The audio signal can be an audio stream. The audio signal can be continuously monitored. The audio signal can be monitored in an always-on fashion.

At step 620, the audio signal can be compared to one or more predetermined command phrases for a predetermined period of time. The predetermined command phrases can be accessible locally by the electronic device as described in relation to step 520 in FIG. 5, or the predetermined phrases can be remotely accessed, for example through a local or secure network. The command phrases can the limited set of commands 340 such as illustrated in FIG. 3, otherwise described herein, alternatives thereof, and variations thereof as would be appreciated and understood by a person of ordinary skill in the art according to the teachings of the present disclosure.

At step 630, based on the comparison, it can be determined whether the audio signal included one or more of the predetermined command phrases during the predetermined period of time. If, YES, the audio signal in the predetermined time period does include one or more of the predetermined command phrases, the method 600 proceeds to step 640. If, NO, the audio signal in the predetermined time period does not include any predetermined command phrase, the method 600 proceeds to step 650.

At step 640, one or more command instructions can be provided that are associated with the one or more predetermined command phrases detected in step 630. The instructions can be executed to cause on device action 330 such as illustrated in FIG. 3, otherwise described herein, alternatives there of, and variations thereof as would be appreciated and understood by a person of ordinary skill in the art according to teachings of the present disclosure.

At step 650, the audio signal from the predetermined time period can be transmitted to an external network. In other words, steps 610 through 640 can be executed by the singular electronic device or the networked computing system as described in relation to step 610, and when no predetermined command phrase is detected in step 630, the singular electronic device or the networked computing system can transmit the audio signal to a network external to the device/system configured to execute steps 610 through 640. Such functionality can be advantageous when the singular electronic device or networked computing system has sufficient computing power to recognize the predetermined command phrases, additional computing power is desired to recognize additional command phrases beyond the predetermined command phrases, and the external network to which the device/system transmits has sufficient computing power and is configured to recognize the additional command phrases.

Figure 7:
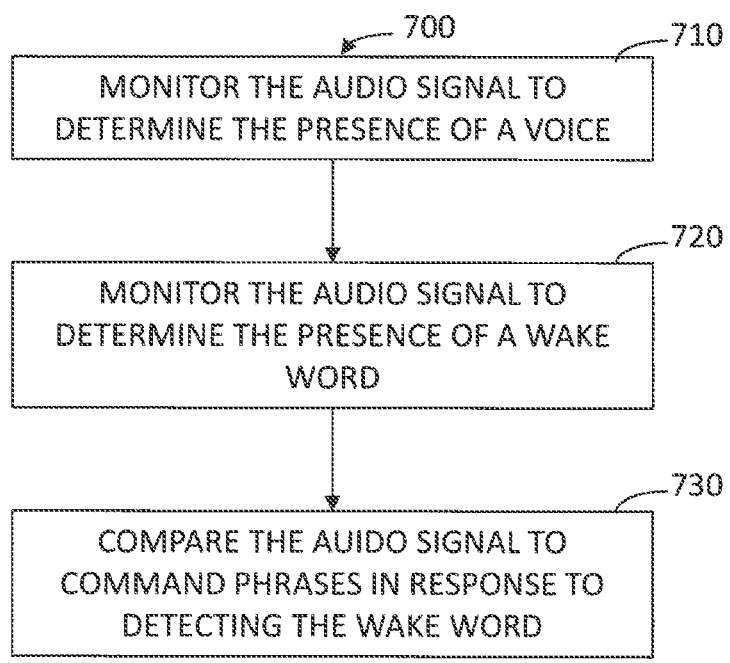
FIG. 7 is a flow diagram for monitoring for voice commands.

Referring to FIG. 7, method 700 for monitoring an audio signal in a hybrid based voice recognition system can include the following steps. The steps can be executed in various orders as would be appreciated and understood by a person of ordinary skill in the art according the teachings of this disclosure. One or more of the steps can be executed by a hybrid based voice recognition system such as the systems 300, 400 described herein, variations thereof, and alternatives thereof as would be appreciated and understood by a person of ordinary skill in the art according to teachings of the present disclosure. Referring to FIG. 5 and FIG. 6, method steps 510 and 610 can include one or more of the steps of method 700 illustrated in FIG. 7. Likewise, method 700 can be executed continuously on a computing device or system as described in relation of steps 510 and 610 illustrated in FIG. 5 and FIG. 6.

At step 710, an audio signal can be monitored to determine the presence of a voice. Step 710 can be executed by a VAD as described herein, a variation thereof, or an alternative thereof as would be appreciated and understood by a person of ordinary skill in the art according to the teachings of the present disclosure.

At step 720, the audio signal can be monitored to determine the presence of a wake word. Step 720 can be executed by a keyword spotting module as described herein, a variation thereof, or an alternative thereof as would be appreciated and understood by a person of ordinary skill in the art according to the teachings of the present disclosure.

At step 730, the audio signal can be compared to command phrases in response to detecting the wake word. The comparison of the command phrases can be executed according to method step 520 in FIG. 5, step 620 in FIG. 6, or as otherwise described herein.

Example systems and method presented herein may be implemented using a computer-readable medium that may be any available medium that may be accessed by the processor. The computer-readable medium may include both a volatile and a nonvolatile medium, a removable and non-removable medium, and a storage medium. The storage medium may include RAM, flash memory, ROM, erasable programmable read-only memory (EPROM), electrically erasable programmable read-only memory (EEPROM), registers, hard disk, a removable disk, a compact disk read-only memory (CD-ROM), or any other form of storage medium. The processor may be operatively coupled via a bus to a display, such as a Liquid Crystal Display (LCD). The display may display information to the user. A keyboard and a cursor control device, such as a touch screen, can also be operatively coupled to bus to enable the user to interface with system.

The processor may be operatively coupled via the bus to one or more databases. The database may store data in an integrated collection of logically-related records or files. The database may be an operational database, an analytical database, a data warehouse, a distributed database, an end-user database, an external database, a navigational database, an in-memory database, a document-oriented database, a real-time database, a relational database, an object-oriented database, a NoSQL database, or any other database, or any combination thereof.

The memory may store software modules that provide functionality when executed in combination with the processor. The modules can include a data visualization module. The data visualization module may include a data visualization application that can collect, organize, synchronize, and display case data. The data visualization module may comprise a plurality of modules that each provide specific individual functionality for collecting, organizing, synchronizing, entering, modifying, and displaying data. The memory may also store an operating system. The operating system may provide operating system functionality for the system. The memory may also store one or more additional applications to include additional functionality for an overall system 100, 200, 300, 400.

The term "computing system" is intended to include stand alone machines or devices and/or a combination of machines, components, modules, systems, servers, processors, memory, detectors, user interfaces, computing device interfaces, network interfaces, hardware elements, software elements, firmware elements, and other computer-related units. By way of example, but not limitation, a computing system can include one or more of a general-purpose computer, a special-purpose computer, a processor, a portable electronic device, a portable electronic medical instrument, a stationary or semi-stationary electronic medical instrument, or other electronic data processing apparatus.

The terms "component," "module," "system," "server," "processor," "memory," and the like are intended to include one or more computer-related units, such as but not limited to hardware, firmware, a combination of hardware and software, software, or software in execution. For example, a component may be, but is not limited to being, a process running on a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets, such as data from one component interacting with another component in a local system, distributed system, and/or across a network such as the Internet with other systems by way of the signal.

The detailed description, above, sets forth numerous specific details to provide a thorough understanding of the present disclosure. However, those skilled in the art will appreciate that the present disclosure may be practiced without these specific details. In other instances, well known methods, procedures, components, and circuitry have not been described in detail to avoid obscuring the present disclosure. Project type configurations may be created automatically by the system or by the user of the system through an interface. The resulting project types may result in outputs suitable for use in the data models and the workflow models.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the disclosure is defined and limited only by the claims that follow.

What is claimed is:

1. An electronic device, comprising:
a non-transitory computer readable storage medium having information stored thereon, the information comprising a plurality of command phrases,
wherein each of the plurality of command phrases is associated with a respective command instruction;
a network transceiver in communication with a remote system; and
an electrical circuit in communication with non-transitory computer readable storage medium and the network transceiver, the electrical circuit configured to
receive an audio signal,
monitor the audio signal with a single, unitary interface to determine a presence of at least one of the plurality of command phrases, a first one of the plurality of command phrases being associated with a first command instruction to cause the network transceiver to transmit the audio signal for further processing on the remote system and a second one of the plurality of command phrases being associated with a second command instruction configured to be locally executed on a portable electronic device without transmission of the audio signal to the remote system; and
selectively provide the respective command instruction associated with a detected command phrase to be transmitted to the remote system the received audio signal or locally executed based upon an evaluation of the plurality of command phrases either the first one of the plurality of command phrases or the second one of the plurality of command phrases, respectively.

2. The electronic device of claim 1, wherein the portable electronic device is an "always-listening" device.

3. The electronic device of claim 1,
wherein the information further comprises a wake word, and
wherein the electrical circuit is further configured to monitor the audio signal to determine a presence of the wake word.

4. The electronic device of claim 1, wherein a third command phrase of the plurality of command phrases is associated with the respective command instruction to cause the network transceiver to cease transmitting the audio signal.

5. The electronic device of claim 1, wherein the electrical circuit comprises a digital signal processor.

6. The electronic device of claim 1, wherein the electrical circuit comprises a neural network circuit.

7. The electronic device of claim 6, wherein the neural network circuit comprises one or more of a convolutional neural network or a recurrent neural network.

8. The electronic device of claim 1, wherein the electrical circuit comprises:
  a voice activity detection (VAD) module configured to monitor the audio signal to determine a presence of a voice;
  a keyword spotting module in communication with the VAD module and a memory store, the keyword spotting module configured to activate in response to the presence of the voice in the audio signal determined by the VAD and, while activated, monitor the audio signal to determine a presence of a wake word; and
  a detection and recognition of commands module in communication with the memory store, the network transceiver, and the keyword spotting module, the recognition of commands module configured to activate in response to the presence of the wake word determined by the keyword spotting module and, while activated, monitor the audio signal to determine a presence of a command phrase of a plurality of predetermined command phrases, provide a command instruction associated with the detected command phrase.

9. The electronic device of claim 8, wherein, while the electronic device is powered on, the audio signal is continuously being monitored by the VAD, monitored by the keyword spotting module, monitored by the detection and recognition of commands module, or transmitted by the network transceiver.

10. The electronic device of claim 8, wherein the keyword spotting module is further configured to deactivate at a first predetermined time period from a time at which the keyword spotting module is activated.

11. The electronic device of claim 8, wherein the detection and recognition of commands module is further configured to deactivate at a second predetermined time period from a time at which the detection and recognition of commands module is activated.

12. A system comprising:
  a non-transitory computer readable storage medium having information stored thereon, the information comprising a plurality of command phrases and a wake word,
    wherein each of the plurality of command phrases is associated with a respective command instruction;
  a network transceiver in communication with a remote system; and
  an electrical circuit in communication with non-transitory computer readable storage medium and the network transceiver, the electrical circuit configured to receive an audio signal,
  monitor the audio signal with a single, unitary interface for a predetermined time period,
  compare the audio signal during the predetermined time period to the plurality of command phrases to evaluate an inclusion of a first one of the plurality of command phrases associated with a first command instruction to cause the network transceiver to transmit the audio signal for further processing on the remote system or a second one of the command phrases associated with a second command instruction configured to be locally executed without transmission of the audio signal to the remote system, and
  based on the comparison, selectively provide a corresponding command instruction for either local execution or transmission to the network transceiver of an audio input signal monitored by a detection and recognition of commands module during the predetermined time period for further processing on the remote system.

13. The system of claim 12, wherein the electrical circuit is configured to begin monitoring the audio signal in response to powering on the electrical circuit and continuously monitor the audio signal while the electrical circuit is powered on.

14. The system of claim 12, wherein the electrical circuit comprises a neural network circuit, the neural network circuit comprises one or more of a convolutional neural network or a recurrent neural network.

15. The system of claim 12, wherein the electrical circuit comprises:
  a voice activity detection (VAD) module configured to monitor the audio input signal to determine a presence of a voice in the audio input signal;
  a keyword spotting module in communication with the VAD module and a memory store, the keyword spotting module configured to activate in response to the presence of the voice in the audio input signal determined by the VAD and, while activated, monitor the audio input signal to determine a presence of the wake word;
  a detection and recognition of commands module in communication with the memory store, the network transceiver, and the keyword spotting module, the detection and recognition of commands module configured to activate in response to the presence of the wake word determined by the keyword spotting module and, while activated, monitor the audio input signal to for the predetermined time period, compare the audio input signal during the predetermined time period to the plurality of command phrases, and based on the comparison, either provide a command instruction associated with a command phrase of the plurality of command phrases or transmit the audio input signal monitored by the detection and recognition of commands module during the predetermined time period to the network transceiver.

16. The system of claim 15, wherein, while the system is powered on, the audio input signal is continuously being monitored by the VAD, monitored by the keyword spotting module, monitored by the detection and recognition of commands module, or transmitted by the network transceiver.

17. The system of claim 15, wherein the keyword spotting module is further configured to deactivate at a first predetermined time period from a time at which the keyword spotting module is activated.

18. The system of claim 15, wherein the detection and recognition of commands module is further configured to deactivate at a second predetermined time period from a time at which the detection and recognition of commands module is activated.

19. A method comprising:
  monitoring, by an electronic device, an audio signal;
  comparing, for a predetermined time period by the electronic device, the audio signal to a plurality of predetermined command phrases stored on the electronic device;

detecting, by the electronic device as a single, unitary interface, an input command phrase as being either a first command phrase of the plurality of predetermined command phrases in the audio signal associated with a first command instruction for local execution or a second command phrase of the plurality of predetermined command phrases in the audio signal for remote execution selectively executing, by the electronic device, the first command instruction locally on the electronic device or transmitting, by the electronic device, the audio signal to an external network connected to a remote system for further processing of the second command phrase thereby, in response to the detection of the first command phrase or the second command phrase, respectively.

20. The method of claim 19, further comprising:

monitoring, by the electronic device, the audio signal to determine a presence of a voice in the audio signal; and monitoring, by the electronic device, in response to determining the presence of the voice in the audio signal, the audio signal to determine a presence of the wake word, and comparing, by the electronic device, in response to determining the presence of the wake word, the audio signal to plurality of predetermined command phrases.

* * * * *